United States Patent
Minechika

(10) Patent No.: US 6,426,923 B1
(45) Date of Patent: Jul. 30, 2002

(54) MAGNETIC HEAD DRIVE CIRCUIT AND MAGNETIC RECORDER

(75) Inventor: Shigekazu Minechika, Kishiwada (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/926,142

(22) PCT Filed: Mar. 29, 2000

(86) PCT No.: PCT/JP00/01978
§ 371 (c)(1),
(2), (4) Date: Sep. 10, 2001

(87) PCT Pub. No.: WO00/58951
PCT Pub. Date: Oct. 5, 2000

(30) Foreign Application Priority Data

Mar. 31, 1999 (JP) ............................................. 11-090912

(51) Int. Cl.⁷ ............................................... G11B 11/00
(52) U.S. Cl. ...................................... 369/13.22; 360/59
(58) Field of Search .......................... 369/13.14, 13.17, 369/13.22, 13.23, 13.2; 360/59, 66–68, 46, 123

(56) References Cited

U.S. PATENT DOCUMENTS

| 5,121,369 A | * | 6/1992 | Makansi | 369/13.22 |
| 5,303,212 A | * | 4/1994 | Sugiyama | 369/13.22 |
| 5,377,172 A | * | 12/1994 | Hino et al. | 369/13.22 |
| 5,500,839 A | * | 3/1996 | Miyake et al. | 369/13.22 |
| 5,559,763 A | * | 9/1996 | Ishii | 369/13.22 |
| 5,661,612 A | * | 8/1997 | Hasegawa et al. | 360/59 |
| 5,748,573 A | * | 5/1998 | Ohmori | 369/13.22 |
| 5,991,242 A | * | 11/1999 | Ishii | 369/13.22 |

FOREIGN PATENT DOCUMENTS

| JP | 4-274003 | 9/1992 |
| JP | 5-325118 | 12/1993 |

* cited by examiner

Primary Examiner—Ali Neyzari
(74) Attorney, Agent, or Firm—Armstrong, Westerman & Hattori, LLP

(57) ABSTRACT

A magnetic head drive circuit comprises a control circuit for receiving a recording signal for recording data on a recording medium with use of magnetism and producing a control signal based on the recording signal, and a switch circuit comprising switching FETs for changing the direction of current to be passed through a field coil of a magnetic head based on the control signal received from the control circuit. Pch FETs and Nch FETs are both used as the switching FETs. The maximum value of the gate voltage of the switching FETs is lower than the voltage Vd of a coil power source for supplying the current to be passed through the field coil and higher than the gate threshold voltage of the switching FETs.

4 Claims, 4 Drawing Sheets

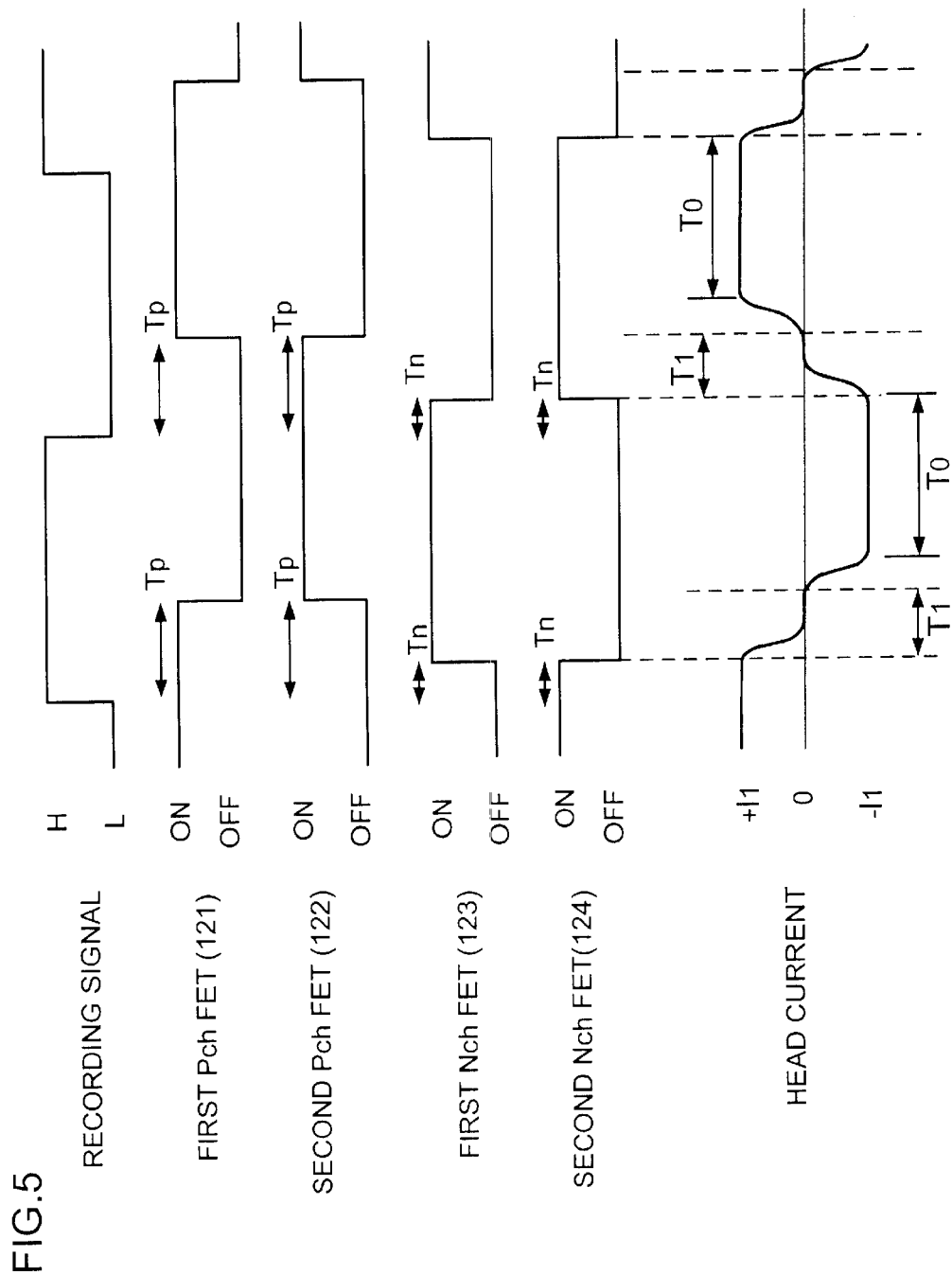

MAGNETIC HEAD DRIVE CIRCUIT AND MAGNETIC RECORDER

TECHNICAL FIELD

The present invention relates to magnetic recording devices for recording information on recording media with use of magnetism, such as optomagnetic disk drives, hard disk drives, etc., and more particularly to a magnetic head drive circuit for use in the magnetic recording device. Stated more specifically, the present invention relates to improvements in the switching characteristics of a switch circuit for changing the direction of the current to be passed through the field coil of a magnetic head.

BACKGROUND ART

The magnetic recording device is adapted to convert information to a recording signal which is a digital voltage signal and to hold a recording medium magnetized in directions corresponding to the recording signal to record the information on the medium. The device comprises a magnetic head for setting up a magnetic field on the recording medium, and the magnetic head has a field coil for producing the magnetic field from current. The magnetic recording device further comprises a magnetic head drive circuit for energizing the field coil and changing the direction of the current for energizing the field coil based on the recording signal.

FIG. 4 is a diagram showing a conventional magnetic head drive circuit. The magnetic head drive circuit 100 comprises a control circuit 110 for producing a control signal based on a recording signal, and a switch circuit 120 for changing the direction of current for energizing a field coil 101 based on the control signal received from the control circuit 110. The switch circuit 120 comprises switch elements for turning on or off a current path based on the control signal received from the control circuit 110.

The switch elements to be used in the magnetic head drive circuit are preferably those which are short in switching time taken for a change of the current state to an on state or off state after the reception of the control signal from the control circuit. For this reason, FETs (field-effect transistors) are used specifically as illustrated.

There are two types of FETs: the N-channel type and the P-channel type. The Nch (channel) FET is such that the drain is connected to the high potential side and the source to the low potential side. The transistor conducts, permitting current to flow from the drain to the source, when the voltage between the gate and the source (hereinafter referred to as "gate voltage") rises beyond a threshold voltage. When the gate voltage drops below the threshold voltage, the transistor is brought out of conduction to block the passage of current. On the other hand, the Pch FET is such that the source is connected to the high potential side, and the drain to the low potential side. The transistor conducts when the gate voltage drops below the threshold voltage, permitting current to flow from the source to the drain. When the gate voltage rises above the threshold voltage, the transistor is brought out of conduction to block the passage of current.

To obtain a stabilized gate voltage, it is desirable to use the Nch FET which is connected at the source to the low potential side in the case where the potential at the low potential side is stable. In the case where the high potential side is stable, the Pch FET is preferable to use which is connected to the high potential side at its source.

Accordingly, the switch elements connected to a power source terminal 102 of positive potential as shown in FIG. 4 are preferably Pch FETs, while the switch elements connected to a ground terminal 103 are preferably Nch FETs.

With reference to the magnetic head drive circuit of FIG. 4, the power source terminal 102 of positive potential Vd is connected to the sources S of first and second Pch FETs 121, 122. The drain D of the first Pch FET 121 is connected to one end of the field coil 101 and the drain of a first Nch FET 123. The drain of the second Pch FET 122 is connected to the other end of the field coil 101 and the drain of a second Nch FET 124. The sources of the first and second Nch FETs 123, 124 are connected to the ground terminal 103. In this way, the switch elements arranged on sides of an electric path surrounding a rectangle, the power from the power source is supplied between two nodes 125, 126 on one pair of opposed sides, and the field coil 101 is connected between two nodes 127, 128 on the other pair of opposed sides. The circuit thus constructed is generally termed a "bridge circuit."

The control circuit 110 comprises amplifiers 111, 112 for amplifying recording signals and recording signals as inverted, respectively. Power is supplied to the amplifiers 111, 112 from the power source terminal 102. The first amplifier 111 receives the recording signal, amplifies voltage of high (H) level to Vd volts and feeds the resulting voltage to the first Pch and first Nch FETs 121, 123. The second amplifier 112 receives the recording signal as inverted, amplifies voltage of high (H) level to Vd and feeds the resulting voltage to the second Pch and second Nch FETs 122, 124.

When the control circuit 110 of the magnetic head drive circuit 100 thus constructed receives a recording signal of H level, the first amplifier 111 applies voltage of H level to the gates of the first Pch and first Nch FETs 121, 123, and the second amplifier 112 applies voltage of L level to the gates of the second Pch and second Nch FETs 122, 124. This brings the first Pch FET 121 and the second Nch FET 124 out of conduction, and the second Pch FET 122 and the first Nch FET 123 into conduction. Accordingly, current can be passed from the power source terminal 102 to the ground terminal 103 via the second Pch FET 122, the field coil 101 and the first Nch FET 123. The current flows through the field coil 101 in the direction of arrow A.

Next, when the control circuit 110 receives a recording signal of L level, the first amplifier 111 applies voltage of L level to the gates of the first Pch and first Nch FETs 121, 123, and the second amplifier 112 applies voltage of H level to the gates of the second Pch and second Nch FETs 122, 124. This brings the first Pch FET 121 and the second Nch FET 124 into conduction, and the second Pch FET 122 and the first Nch FET 123 out of conduction. Accordingly, current can be passed from the power source terminal 102 to the ground terminal 103 via the first Pch FET 121, the field coil 101 and the second Nch FET 124. The current flows through the field coil 101 in the direction of arrow B.

Thus, the direction of the current through the field coil 101 can be changed by the magnetic head drive circuit 110 of the construction described in accordance with the voltage level of the recording signal.

However the conventional construction has the following problem.

While the current (hereinafter referred to as "head current") flowing through the field coil 101 is given the desired value for the magnetic head to set up a magnetic field of desired intensity on the recording medium, it is desired that the period during which the magnetic field retains the desired intensity be longer. For this purpose, it is desirable that the switching FETs 121, 122, 123, 124 of the magnetic head drive circuit 100 can be changed over rapidly. However, the Pch FET is greater than the Nch FET in the time constant of charging or discharging at the gate. Accordingly, the period Tp taken for the Pch FETs 121, 122 to change the on-off state thereof after the reception of the control signal until the gate is charged or discharged past the threshold voltage for the change is longer than the corresponding period Tn taken for the Nch FETs. Accordingly, the head current will not become the desired value during the period T1 from the change of on-off state of the Nch FETs until the change of on-off state of the Pch FETs. As a result, the period T0 becomes shorter during which the head current is given the desired value ±I1.

An object of the present invention is to provide a magnetic head drive circuit wherein Nch FETs and Pch FETs are both used as switching FETs and which is prolonged in the period during which the magnetic field to be set up by a magnetic head on a recording medium is given the desired intensity.

DISCLOSURE OF THE INVENTION

The present invention relates to a magnetic head drive circuit comprising a control circuit for receiving a recording signal for recording data on a recording medium with use of magnetism and producing a control signal based on the recording signal, and a switch circuit for changing the direction of current to be passed through a field coil of a magnetic head based on the control signal received from the control circuit, the switch circuit comprising switching FETs for changing the current direction. Pch and Nch FETs are both used as the switching FETs of the switch circuit.

To fulfill the foregoing object, the magnetic head drive circuit of the invention is characterized in that the maximum value of the gate voltage to be applied to the gates of the switching FETs is lower than the voltage of a coil power source for supplying the current to be passed through the field coil and higher than the gate threshold voltage of the switching FETs.

BRIEF DESCRIPTION OF THE DRAWINGS

FIG. 5 is a graph showing changes with time in the on-off state of switching FETs in a switch circuit, and variations with time in head current through a field coil, as determined based on a recording signal for the conventional magnetic head drive circuit.

BEST MODE OF CARRYING OUT THE INVENTION

An embodiment of the present invention will be described below with reference to the drawings.

Figure 1:
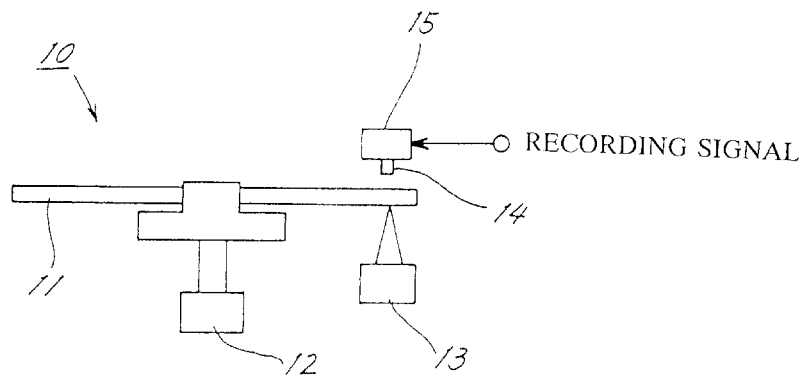
FIG. 1 is a diagram showing the main components of an optomagnetic disk drive.

FIG. 1 shows the main components of an optomagnetic disk drive wherein the magnetic head drive circuit of the present invention is used. The disk drive 10 is for use with a disk (optomagnetic disk) 11 wherein the recording layer comprises a magnetic material having a great coercive force, and is a disk recording-playback device wherein a laser beam and an external magnetic field are used for writing signals to the disk 11, and the signals are read from the disk with use of a laser beam. The optomagnetic disk drive 10 comprises a disk motor 12 for rotating the disk 11, an optical pickup 13 for projecting the laser beam onto a track of the disk 11 and detecting the light reflected therefrom, and a magnetic head 14 for setting up a magnetic field on the track of the disk 11. The magnetic head 14 comprises a field coil 16 for producing a magnetic field from current (see FIG. 2). The disk drive 10 further comprises a magnetic head drive circuit 15 for energizing the field coil 16 of the magnetic head 14, receiving a recording signal for recording on the disk 11 from the main unit and changing the direction of the current to be passed through the field coil based on the recording signal.

Figure 2:
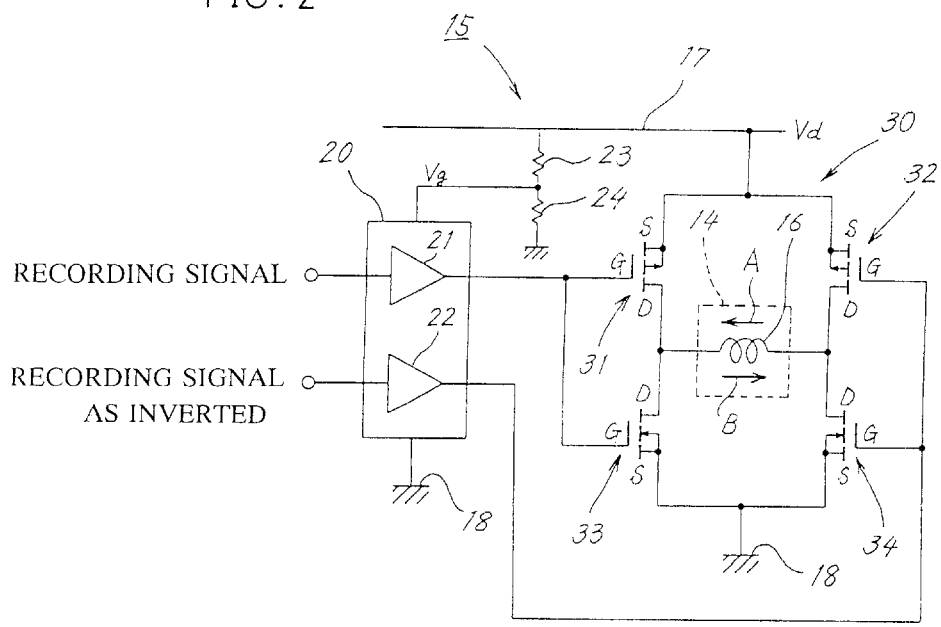
FIG. 2 is a diagram showing a magnetic head drive circuit according to the present embodiment.

FIG. 2 shows the magnetic head drive circuit of the present invention.

The magnetic head drive circuit 15 comprises a control circuit 20 for receiving the recording signal from the main unit and producing a control signal based on the recording signal, and a switch circuit 30 for changing the direction of the current to be passed through the field coil 16 of the magnetic head 14 based on the control signal received from the control circuit 20. The recording signal is a voltage signal comprising a voltage of H (high) level and a voltage of L (low) level (see FIG. 3).

According to the present embodiment, the switch circuit 30 is a bridge circuit comprising two Pch FETs 31, 32 and two Nch FETs 33, 34 serving as switch elements. A power source terminal 17 of positive potential Vd is connected to the sources of first Pch FET 31 and second Pch FET 32. The drain of the first Pch FET 31 is connected to one end of the field coil 16 and the drain of first Nch FET 33. The drain of the second Pch FET 32 is connected to the other end of the field coil 16 and the drain of second Nch FET 34. The sources of the first and second Nch FETs 33, 34 are connected to a ground terminal 18.

Power is supplied from the power source terminal 17 of positive potential Vd to the control circuit 21 via resistors 23, 24. Accordingly, voltage Vg lower than the power source voltage Vd is supplied. The resistance values R1, R2 of the resistors 23, 24 are set at suitable values so that the voltage Vg will be higher than the gate threshold voltage of the FETs 31, 32, 33, 34. Incidentally, the main unit of the disk drive 10 may be provided with a control power source, which is separate from the coil drive power source for driving the switch circuit 30 and the field coil 16, for supplying the voltage Vg which is lower than the voltage Vd of the coil power source and higher than the gate threshold voltage, for the control power source to supply power to the control circuit 20.

The control circuit 20 comprises amplifiers 21, 22 for amplifying the recording signal and the recording signal as inverted, respectively. The voltage Vg is supplied to the amplifiers 21, 22. The first amplifier 21 receives the recording signal, amplifies voltage of high (H) level to Vg volts and feeds the resulting voltage to the first Pch and first Nch FETs 31,33. The second amplifier 22 receives the recording signal as inverted, amplifies voltage of high (H) level to Vg volts and feeds the resulting voltage to the second Pch and second Nch FETs 32, 34.

When the control circuit 20 of the magnetic head drive circuit 15 thus constructed receives a recording signal of H level, the first amplifier 21 applies voltage of H level to the gates of the first Pch and first Nch FETs 31, 33, and the second amplifier 22 applies voltage of L level to the gates of the second Pch and second Nch FETs 32, 34. This brings the first Pch FET 31 and the second Nch FET 34 out of conduction, and the second Pch FET 32 and the first Nch FET 33 into conduction. Accordingly, current can be passed from the power source terminal 17 to the ground terminal 18 via the second Pch FET 32, the field coil 16 and the first Nch FET 33. The current flows through the field coil 16 in the direction of arrow A.

Next, when the control circuit 20 receives a recording signal of L level, the first amplifier 21 applies voltage of L level to the gates of the first Pch and first Nch FETs 31, 33, and the second amplifier 22 applies voltage of H level to the gates of the second Pch and second Nch FETs 32, 34. This brings the first Pch FET 31 and the second Nch FET 34 into conduction, and the second Pch FET 32 and the first Nch FET 33 out of conduction. Accordingly, current can be passed from the power source terminal 17 to the ground terminal 18 via the first Pch FET 31, the field coil 16 and the second Nch FET 34. The current flows through the field coil 16 in the direction of arrow B.

Thus, the direction of the current through the field coil 16 can be changed by the magnetic head drive circuit 15 of the construction described in accordance with the voltage level of the recording signal.

Figure 3:
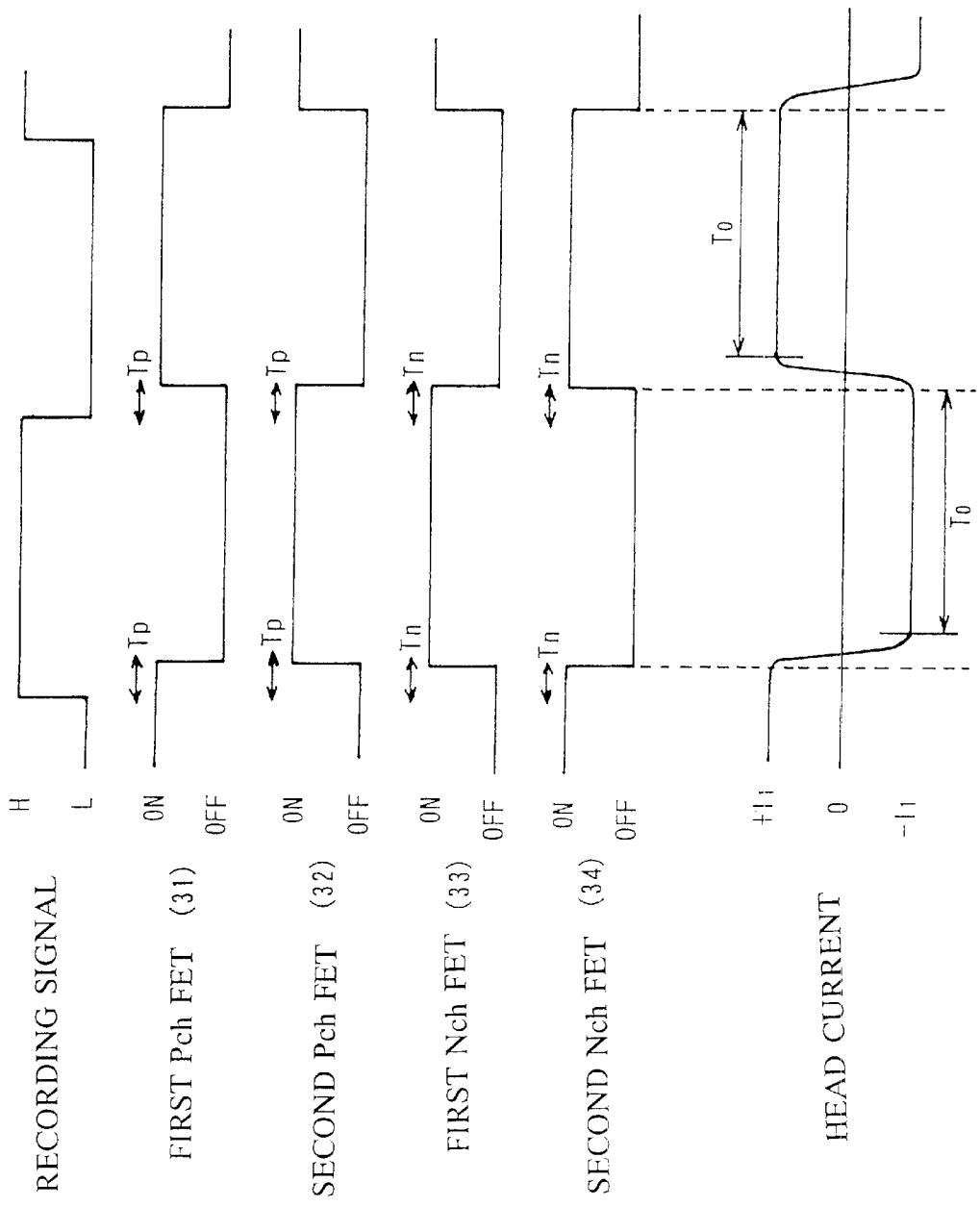
FIG. 3 is a graph showing changes in the on-off state of switching FETs of a switch circuit with time, and variations in the head current flowing through a field coil with time, as determined based on a recording signal for the present embodiment.
Figure 4:
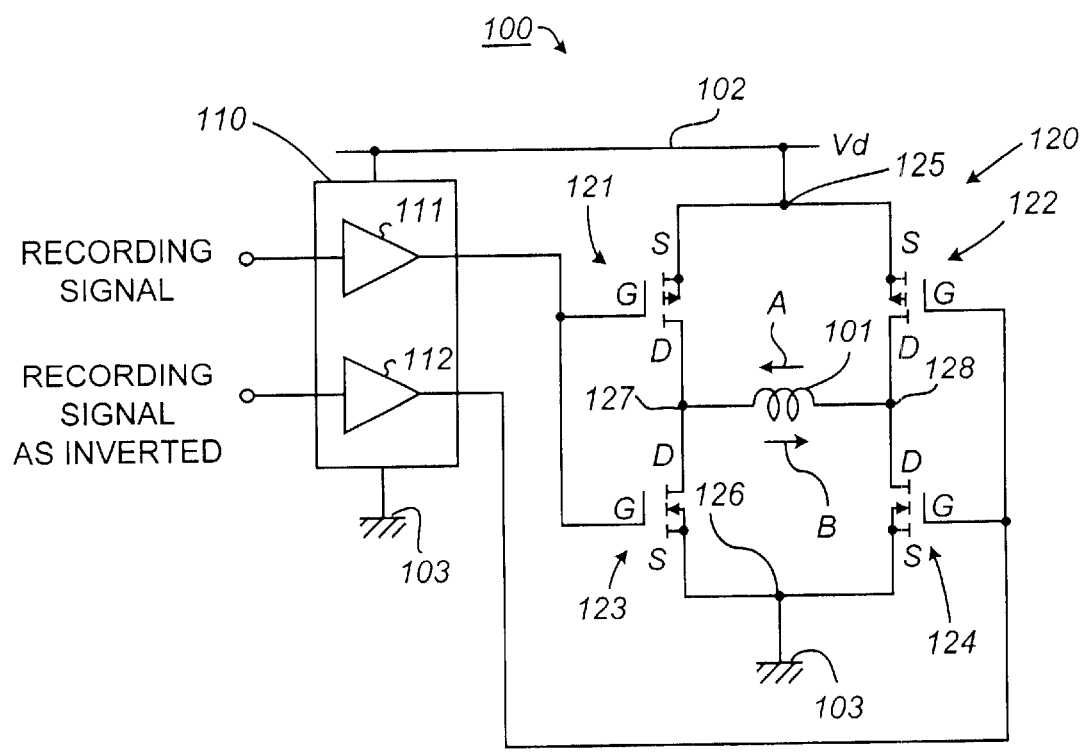
FIG. 4 is a diagram showing a conventional magnetic head drive circuit.

FIG. 3 is a graph showing changes in the on-off state of the FETs 31, 32, 33, 34 with time, and variations in the value of head current flowing through the field coil 16 with time, as determined based on the recording signal for the magnetic head drive circuit 15 of the present embodiment. A comparison of the graph of FIG. 3 with a graph (FIG. 5) obtained for the conventional magnetic head drive circuit 100 indicates that the period Tp taken for the Pch FETs to change the on-off state thereof after the reception of the control signal until the gate is charged or discharged past the threshold voltage for the change can be made approximate to the corresponding period Tn taken for the Nch FETs, prolonging the period TO during which the head current becomes the desired value. This extends the period during which the magnetic field to be set up by the magnetic head on the recording medium is given the desired intensity.

Furthermore, the power source voltage Vg for the control circuit 20 is lower than in the prior art. This serves to suppress power consumption of the control circuit 20.

Although the embodiment described relates to an opto-mangetic disk drive, the present invention is applicable also to other magnetic recording devices, such as hard disk drives, which are adapted to record information on recording media by a recording head at a high speed.

INDUSTRIAL APPLICABILITY

With the magnetic head drive circuit thus constructed, the difference between the maximum value of the gate voltage to be applied to the gates of the switching FETs by the control circuit and the gate threshold voltage is reduced to suppress the influence of the time constant of charging or discharging at the gates. Accordingly, the period taken for the Pch FETs to change the on-off state thereof after the reception of the control signal until the gate is charged or discharged past the threshold voltage for the change can be made approximate to the corresponding period taken for the Nch FETs, prolonging the period during which the head current becomes the desired value. This extends the period during which the magnetic field to be set up by the magnetic head on the recording medium is given the desired intensity.

The present invention is suited to magnetic head drive circuits wherein the power source voltage Vd to be supplied to the switch circuit and the field coil is raised to greatly vary the current to be passed through the field coil and to thereby quickly obtain the desired current value in an attempt to improve the recording density of the recording medium. The reason is that with the conventional magnetic head drive circuit, the coil power source supplies power also to the control circuit, so that when the voltage Vd of the coil power source is raised, the voltage of the control signal produced by the control circuit also rises, increasing the difference between the voltage of high level to be applied to the gates of the FETs and the threshold voltage and consequently increasing the influence of the time constant of charging or discharging at the gates to further shorten the period during which the head current becomes the desired value.

What is claimed is:

1. A magnetic head drive circuit comprising a control circuit for receiving a recording signal for recording data on a recording medium with use of magnetism and producing a control signal based on the recording signal, and a switch circuit for changing the direction of current to be passed through a field coil of a magnetic head based on the control signal received from the control circuit, the switch circuit comprising switching FETs (field-effect transistors) for changing the current direction, the magnetic head drive circuit being characterized in that:

P-channel FETs and N-channel FETs are both used as the switching FETs of the switch circuit, the maximum value of the gate voltage to be applied to the gates of the switching FETs is lower than the voltage of a coil power source for supplying the current to be passed through the field coil and higher than the gate threshold voltage of the switching FETs.

2. A magnetic head drive circuit according to claim 1 wherein the switch circuit has a bridge circuit comprising the switching FETs on respective sides of a bridge, and electric power from the coil power source is supplied between two nodes on one pair of opposed sides, the field coil being connected between two nodes on the other pair of opposed sides, two of the four FETs on the respective sides of the bridge connected to a high potential side of the coil power source being the P-channel FETs, the other two FETs connected to a low potential side of the coil power source being the N-channel FETs.

3. A magnetic recording device comprising a magnetic head drive circuit according to claim 1, and a magnetic head for setting up a magnetic field on a recording medium.

4. A magnetic recording device comprising a magnetic head drive circuit according to claim 2, and a magnetic head for setting up a magnetic field on a recording medium.

* * * * *